United States Patent [19]
Honeycutt et al.

[11] Patent Number: 5,753,956
[45] Date of Patent: May 19, 1998

[54] SEMICONDUCTOR PROCESSING METHODS OF FORMING COMPLEMENTARY METAL OXIDE SEMICONDUCTOR MEMORY AND OTHER CIRCUITRY, AND MEMORY AND OTHER CIRCUITRY

[75] Inventors: Jeffrey W. Honeycutt; Fernando Gonzalez, both of Boise, Id.

[73] Assignee: Micron Technology, Inc., Boise, Id.

[21] Appl. No.: 674,655

[22] Filed: Jun. 25, 1996

Related U.S. Application Data

[62] Division of Ser. No. 584,564, Jan. 11, 1996, abandoned.

[51] Int. Cl.$^6$ ............................. H01L 27/04; H01L 29/70
[52] U.S. Cl. ............................. 257/372; 257/376; 257/378
[58] Field of Search .................... 257/372, 373, 257/376, 378

[56] References Cited

U.S. PATENT DOCUMENTS

| | | | |
|---|---|---|---|
| 5,296,409 | 3/1994 | Merrill et al. | 437/34 |
| 5,310,691 | 5/1994 | Suda | 437/34 |
| 5,324,982 | 6/1994 | Nakazato et al. | 257/376 |
| 5,356,821 | 10/1994 | Naruse et al. | 437/34 |
| 5,498,554 | 3/1996 | Mei | 437/57 |
| 5,501,993 | 3/1996 | Borland | 437/34 |
| 5,525,532 | 6/1996 | Kim | 437/6 |
| 5,543,647 | 8/1996 | Kobayashi et al. | 257/376 |

FOREIGN PATENT DOCUMENTS

| | | | |
|---|---|---|---|
| 62-30363 | 2/1987 | Japan | 257/372 |
| 1-265555 | 10/1989 | Japan | 257/373 |

*Primary Examiner*—Donald Monin
*Attorney, Agent, or Firm*—Wells, St. John, Roberts, Gregory & Matkin, P.S.

[57] ABSTRACT

A semiconductor processing method of forming complementary metal oxide semiconductor memory circuitry includes, a) defining a memory array area and a peripheral area on a bulk semiconductor substrate, the peripheral area including a p-well area for formation of NMOS peripheral circuitry, the peripheral area including a first n-well area and a second n-well area for formation of respective PMOS peripheral circuitry, the first and second n-well areas being separate from one another and having respective peripheries; b) providing a patterned masking layer over the substrate relative to the peripheral first and second n-wells, the masking layer including a first masking block overlying the first n-well and a second masking block overlying the second n-well, the first masking block masking a lateral edge of the first n-well periphery; and c) with the first and second masking blocks in place, providing a buried n-type electron collector layer by ion implanting into the bulk substrate; the resultant n-type electron collector layer implant extending to the second n-well periphery to be in electrical connection therewith; the resultant n-type electron collector layer implant being spaced from the first n-well periphery for preventing electrical connection with the first n-well. Memory devices and other circuitry are also disclosed.

6 Claims, 5 Drawing Sheets

SEMICONDUCTOR PROCESSING METHODS OF FORMING COMPLEMENTARY METAL OXIDE SEMICONDUCTOR MEMORY AND OTHER CIRCUITRY, AND MEMORY AND OTHER CIRCUITRY

RELATED PATENT DATA

This patent resulted from a divisional application of U.S. patent application Ser. No. 08/584,564, filed on Jan. 8, 1996, entitled "Semiconductor Processing Methods of Forming Complementary Metal Oxide Semiconductor Memory and Other Circuitry, and Memory and Other Circuitry" listing the inventor as Monte Manning, now abandoned.

TECHNICAL FIELD

This invention relates to semiconductor processing methods of forming complementary metal oxide semiconductor (CMOS) memory and other circuitry, and to memory and other circuitry.

BACKGROUND PRIOR ART TO THE INVENTION

An MOS (metal-oxide-semiconductor) structure in semiconductor processing is created by superimposing several layers of conducting, insulating and transistor-forming materials. After a series of processing steps, a typical structure might comprise levels of diffusion, polysilicon and metal that are separated by insulating layers.

CMOS is so-named because it uses two types of transistors, namely an n-type transistor (NMOS) and a p-type transistor (PMOS). These are fabricated in a semiconductor substrate, typically silicon, by using both n-type (negatively doped) silicon that is rich in electrons and p-type (positively doped) silicon that is rich in holes. Different dopant ions are utilized for doping the desired substrate regions to produce the desired concentrations of holes or electrons.

NMOS remained the dominant MOS technology as long as the integration level devices on a chip was sufficiently low. It is comparatively inexpensive to fabricate, very functional, dense, and faster than PMOS. With the dawning of large scale integration, however, power consumption in NMOS circuits began to exceed tolerable limits. CMOS provided a lower-power technology capable of exploiting large scale integration fabrication techniques.

A typical CMOS twin well structure as is commonly used in prior art CMOS memory devices is illustrated in FIG. 1. Specifically, FIG. 1 illustrates a wafer fragment 10 comprising a p-type silicon substrate 12, an NMOS (p-well) memory array region 14, NMOS (p-well) periphery regions 20a and 20b, and PMOS (n-well) periphery regions 22 and 24. During operation of the CMOS memory chip, the n-well regions are biased to the chip supply voltage Vcc, although in some circuit applications certain n-wells are biased to a greater potential Vccp, which is typically twice Vcc and is commonly achieved by a bootstrapping technique. Therefore during operation of the devices fabricated according to FIG. 1, first n-well 24 is biased to Vcc (labelled $V^2cc$) and second n-well 22 is biased to Vccp (labelled $V^1cc$). P-well regions 14 and 20a/20b are in direct electrical connection with the substrate 12. Such are biased during operation to the desired potential, typically ground and hereafter referred to as Vss, or a slightly negative potential hereafter referred to as Vbb.

A typical method of forming the CMOS twin well structure is to perform a blanket ion implantation of boron (p-type material) over the entire substrate, followed by a photoresist masking step opening the n-well regions, and ion implantation of n-type dopants to form the n-wells. For purposes of the continuing discussion, such defines lateral edges 26 of n-well 22 and lateral edges 28 of n-well 24. Following photoresist stripping, the wafer is then typically subjected to a high temperature "well drive" annealing step which diffuses the implanted n-well and p-well dopants to the desired depths. The process then continues with the fabrication of field oxide isolation regions 15, and fabrication of NMOS and PMOS transistors and other circuit elements. NMOS channel stop implants 13 are provided beneath the field oxide regions in the p-wells, as shown.

Certain aspects of the performance of CMOS memory devices are directly related to the method of fabrication of the CMOS wells as described in FIG. 1, as well as to the bulk substrate properties. For example in a DRAM memory cell typically consisting of an NMOS access device and a capacitor in series, the charge stored on the capacitor upon writing data to the DRAM cell dissipates due to reverse bias leakage of the cell node diode. The length of time over which the DRAM cell can retain a sufficient amount of charge for its intended data state to be determined accurately by a sense amplifier circuit is commonly referred to as "refresh time". Before this period of time expires, the cell must be reprogrammed or "refreshed". It is desirable for the refresh time of a DRAM device to be as long as possible.

This reverse bias diode leakage, which must be controlled to very low levels for acceptable refresh times, consists of two components. A first component is "generation" current due to electron-hole pair generation in the depletion region of the cell node junction. Generation current is very sensitive to the quantity of metallic impurities and crystal defects present in the depletion region of the junction. Extreme care is taken in modern CMOS processing to avoid introduction of metallics and crystal defects, and to trap or "getter" unintentionally introduced impurities at locations away from active regions. "Intrinsic gettering" cycles, wherein oxygen in the silicon substrate is caused to precipitate in the bulk of the silicon wafer to provide sinks for metallics, are often integrated with the CMOS well formation sequence. This is especially true of the well drive step, wherein the oxygen near the surface of the silicon wafer is driven out of the crystal, forming a "denuded zone" in which the devices are fabricated.

A second component of diode leakage is "diffusion" current which occurs by collection of thermally generated minority carriers present in the p-well and substrate which diffuse to the depletion region of the cell node diode. The diffusion length of minority carriers in the silicon substrate can be on the order of hundreds of microns and, since they are thermally generated, their presence in the silicon substrate is unavoidable at normal device operation temperatures of 25°–125° C. In modern state-of-the-art DRAM fabrication facilities, where metallic impurity levels are kept at extremely low levels, efforts to improve refresh times are largely focused on reducing this diffusion current component of diode leakage by engineering of the CMOS wells, as will be discussed below.

In addition to thermal generation of carriers in the silicon substrate, very large densities of electron-hole pairs can be generated by the passage of ionizing radiation such as alpha particles through the silicon substrate. One source alpha particles is the decay radioactive impurities such as uranium or thorium, known to be present in trace levels in common semiconductor packaging materials. This alpha-generated charge can be collected by a particular node in a CMOS device, such as DRAM or SRAM memory cell node, in sufficient quantities so as to upset its data state. Such events are termed "soft errors". Soft error rates must be controlled to very low levels for reliable operation of semiconductor devices.

Recently, novel approaches have been taken in CMOS well processing to increase DRAM refresh times and reduce DRAM/SRAM soft error rates by creating barriers to the diffusion of minority carriers from the substrate to the device active regions. In one such prior art technique, commonly referred to as a retrograde p-well structure, boron is implanted into the p-well through an additional mask layer. This is conducted subsequent to the well drive step at relatively high energy to create a buried peak in the p-well doping profile.

FIG. 2 illustrates a cross-sectional schematic 10s of a typical prior art retrograde well structure. In one embodiment of such prior art, a conventional twin well structure as described in FIG. 1 is formed. Later in the CMOS process, e.g. after completion of LOCOS isolation steps, an additional masking step is provided to form the retrograde p-well layer 34 within the p-well regions. Such have lateral edges 23 which do not extend into the n-well regions. Implant 34 is preferably provided as near the p-well surface and at as high a dose as possible without adversely affecting the NMOS device performance. Retrograde p-well layer/region 34 provides a potential barrier to substrate electrons, effectively reflecting them downwardly back into the substrate such that they do not diffuse into the near surface active region and therefore are not collected at active device nodes. Therefore, junction leakage currents are reduced, and thus DRAM refresh times are improved and soft error rates are reduced.

In another technique, commonly referred to as the triple well structure, a buried n-type layer is formed as described with reference to FIG. 3. Similar to FIG. 1, FIG. 3 illustrates a semiconductor wafer fragment 10t comprised of a bulk p-type silicon substrate 12, an NMOS (p-well) memory array region 14, NMOS (p-well) periphery regions 20a and 20b, and PMOS (n-well) periphery regions 22 and 24, all of which are biased in the same manner as described above for FIG. 1. In the triple well structure, wafer fragment 12 is appropriately masked, typically after LOCOS isolation (not shown in FIG. 2), typically with photoresist, and subjected to an ion implantation effective to provide buried n-type electron collector regions 30 to extend into or through n-wells 22 and n-wells 24. Such regions have separated lateral edges 25 and 27 as shown. Accordingly, respective electrical connection of the electron collector regions 30 is provided by the respective extensions into n-well 22 and n-well 24 as defined by the masking layer used to produce regions 30. The n-type buried regions 30 provides soft error protection and increases DRAM data retention time by collecting stray electrons from the substrate that might otherwise be collected by device active regions.

The masking provided to facilitate production of buried layer/regions 30 leaves all or part of the array portion of p-well region 20b uncovered, but does cover all or part of p-well region 20a to assure that the illustrated two electron collector regions 30 do not connect with one another or short the two different n-wells 22 and 24, which are normally biased at different voltages.

The implant ions utilized to produce layer/regions 30 are typically phosphorus. Although the effectiveness of regions 30 in collecting substrate electrons increases with the phosphorus implant dose, the dose is limited in practice to control its final vertical width such that it does not electrically affect the device active region at the wafer surface. This practical dose limit is dependent on subsequent thermal processing during which diffusive broadening of the phosphorus profile occurs.

It would be desirable to develop methods which facilitate formation of CMOS circuitry within a semiconductor substrate having features to contend with substrate diffusion currents and alpha particle ingestion, and preferably which minimize masking steps.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of forming complementary metal oxide semiconductor memory circuitry comprises the following steps:

defining a memory array area and a peripheral area on a bulk semiconductor substrate, the peripheral area including a p-well area for formation of NMOS peripheral circuitry, the peripheral area including a first n-well area and a second n-well area for formation of PMOS peripheral circuitry, the first and second n-well areas being separate from one another and having respective peripheries;

providing a patterned masking layer over the substrate relative to the peripheral first and second n-wells, the masking layer including a first masking block overlying the first n-well and a second masking block overlying the second n-well, the first masking block masking a lateral edge of the first n-well periphery; and with the first and second masking blocks in place, providing a buried n-type electron collector layer by ion implanting into the bulk substrate; the resultant n-type electron collector layer extending to the second n-well periphery to be in electrical connection therewith; the resultant n-type electron collector layer implant being spaced from the first n-well lateral edge to effectively prevent electrical connection with the first n-well.

In accordance with another aspect of the invention, a semiconductor memory device having complementary metal oxide semiconductor circuitry comprising:

a bulk semiconductor substrate having a memory array area and a peripheral area, the peripheral area including p-well area comprising NMOS peripheral circuitry, the peripheral area including a first n-well area and a second n-well area comprising respective PMOS peripheral circuitry, the first and second n-well areas being separate from one another and having respective peripheries; and a buried n-type electron collector layer implant within the bulk substrate, the n-type electron collector layer implant extending to the second n-well periphery to be in electrical connection therewith, the n-type electron collector layer implant being spaced from the first n-well periphery for preventing electrical connection therewith.

Figure 1:
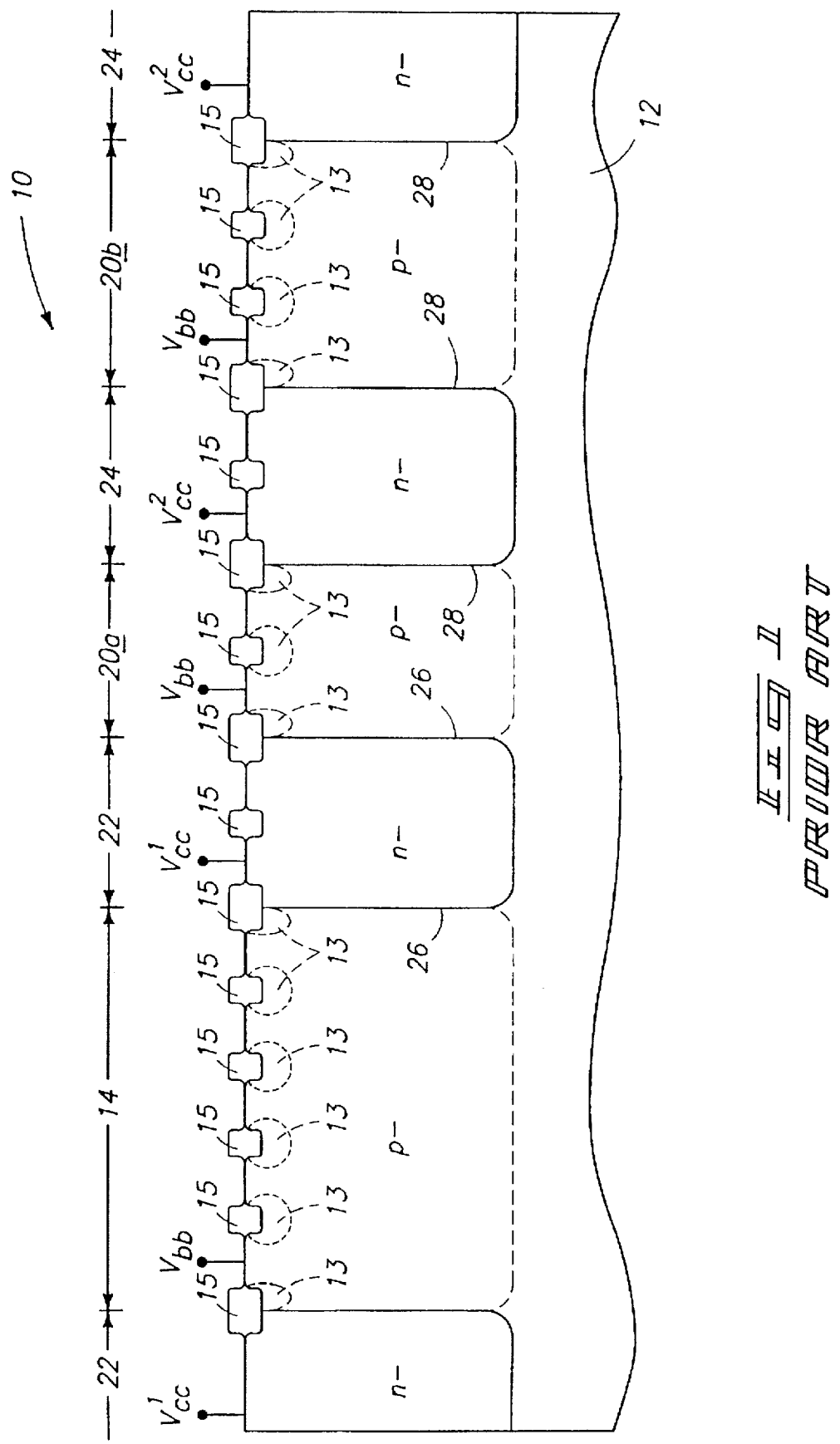
FIG. 1 is a diagrammatic sectional view of a prior art semiconductor wafer fragment and is discussed in the "Background" section above.
Figure 2:
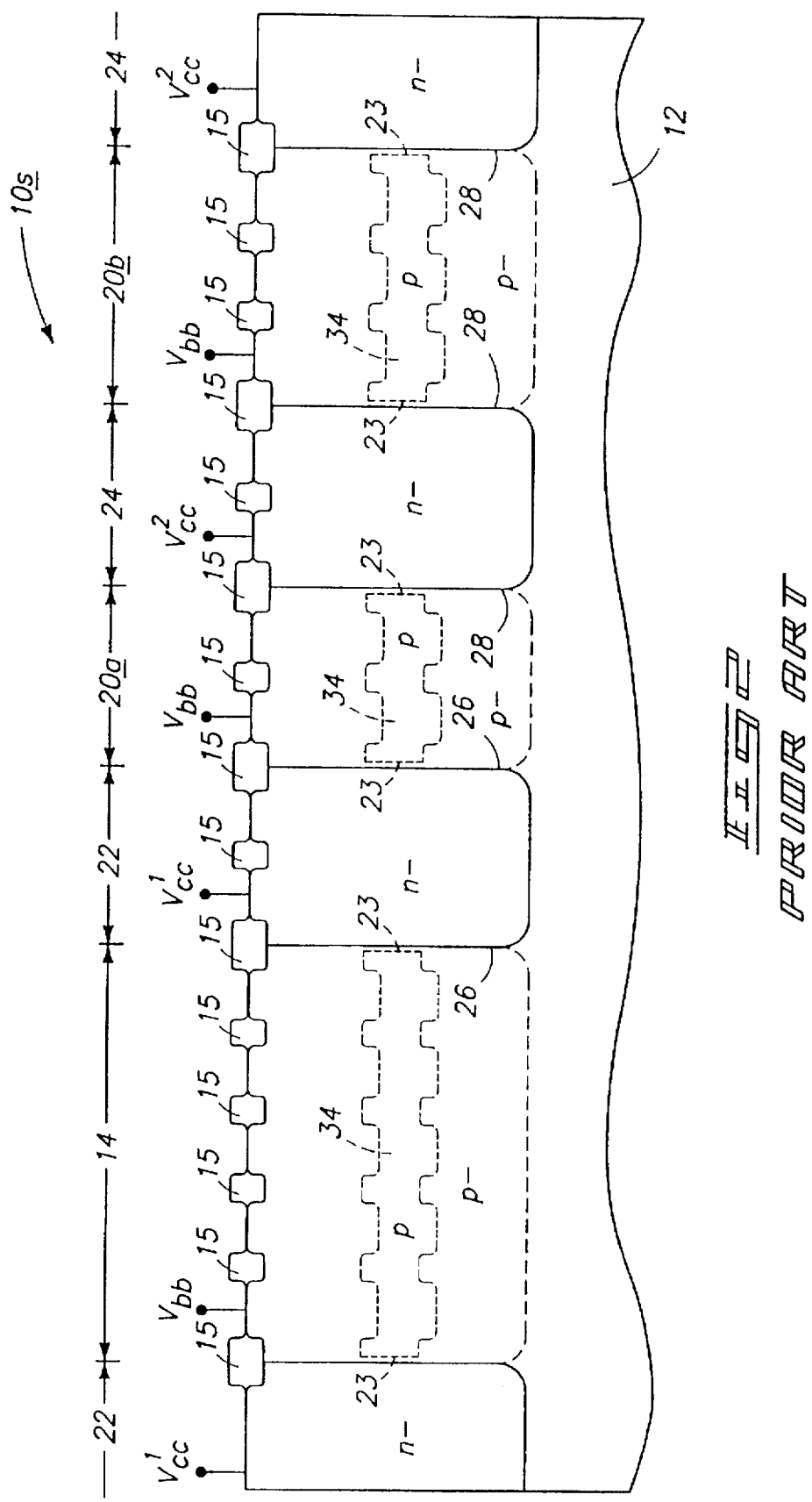
FIG. 2 is a diagrammatic sectional view of an alternate prior art semiconductor wafer fragment and is discussed in the "Background" section above.
Figure 4:
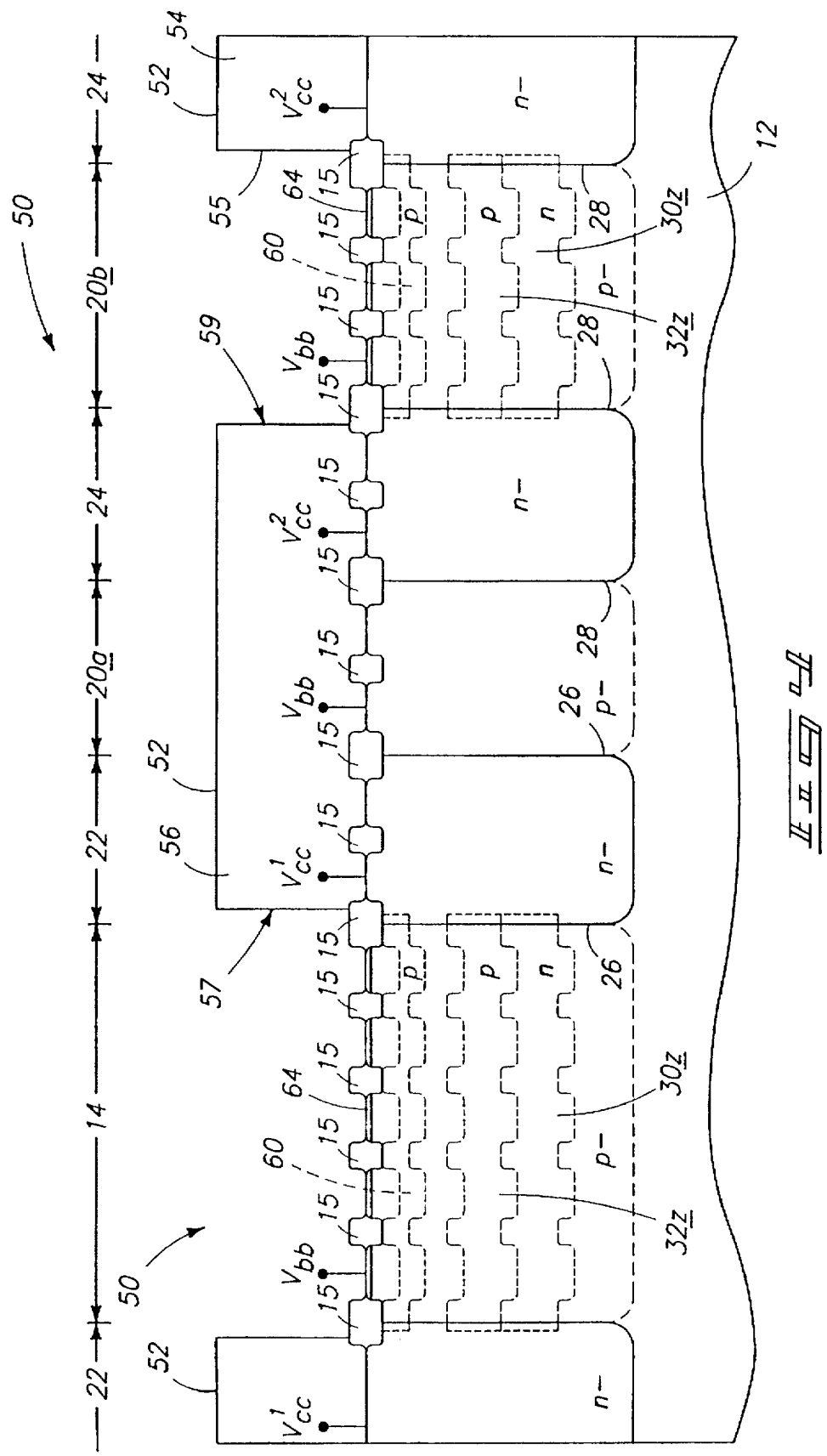
FIG. 4 is a diagrammatic sectional view of a semiconductor wafer fragment in accordance with the invention.
Figure 5:
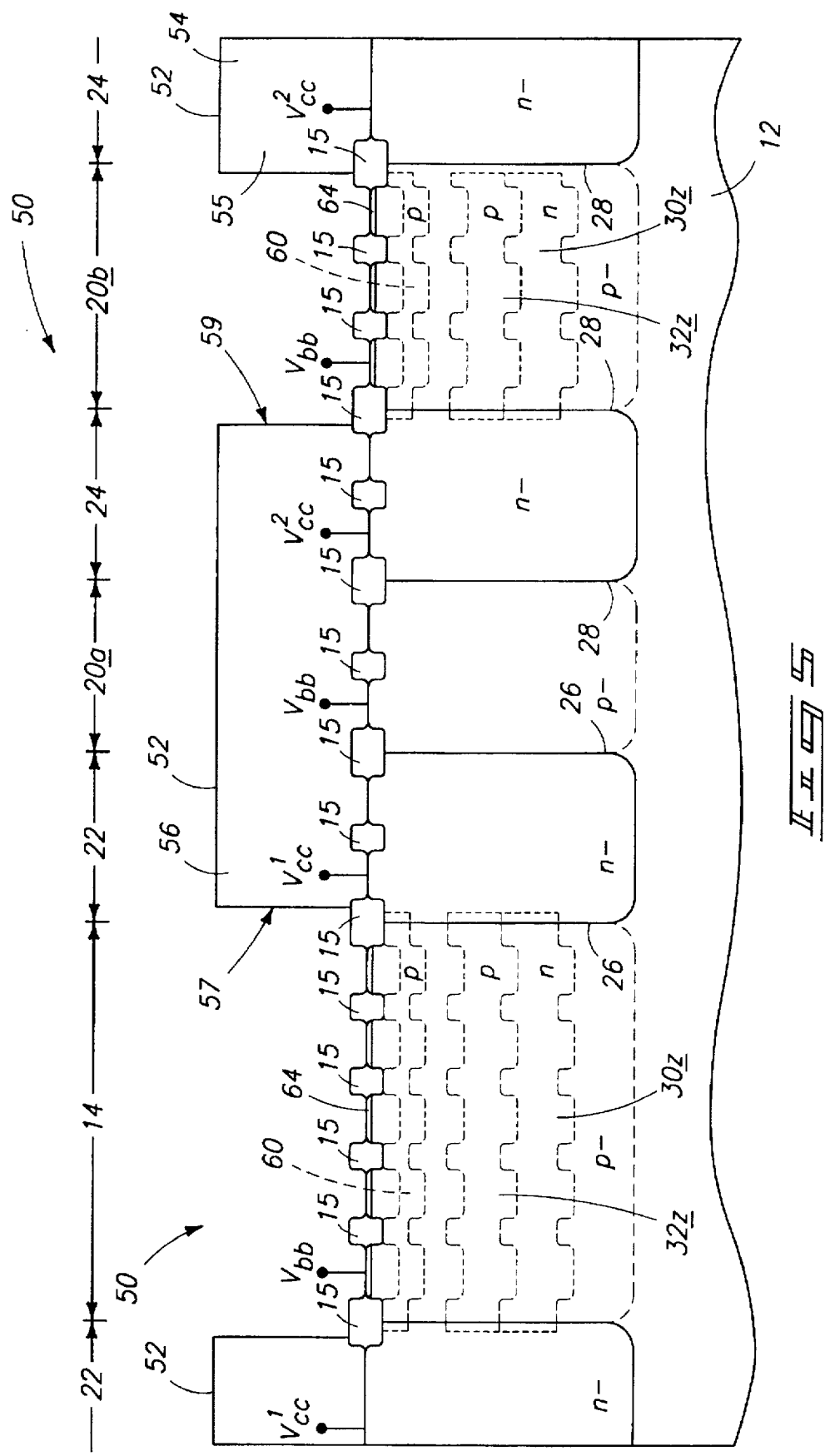
FIG. 5 is a diagrammatic sectional view of a semiconductor wafer fragment in accordance with the invention.

More particularly and with reference to FIGS. 4 and 5, a semiconductor wafer fragment processed in accordance with the invention is indicated generally with reference numeral 50. Like numerals from the prior art FIG. 1 embodiment are utilized where appropriate, with differences being indicated by the suffix "z" or with different numerals. A patterned masking layer 52, preferably photoresist, is provided over the substrate relative to peripheral first n-wells 24 and peripheral second n-wells 22. Such comprises a first masking block 54 which overlies the far right first n-well 24, and a second masking block 56 which overlies the far left second n-well 22. Second masking block 56 also overlies p-well 20a and middle n-well 24. As shown in FIG. 5, first masking block 54 can be provided to extend laterally outward beyond periphery 28 of far right first n-well 24 to mask periphery 28 of first n-well 24 within bulk substrate 12 where implanting will occur. Alternately, and as more preferred and shown, in FIG. 4 first masking block 54 has at least one of its lateral edges (edge 55) contained within the confines of the far right first n-well 24. Likewise, second masking block 56 has at least one of its lateral edges (edge 57) contained within the confines of second n-well 22. Further and preferably, as shown, its other lateral edge 59 is contained within the confines of middle first n-well 24.

With first and second masking blocks 54 and 56 in place, buried n-type electron collector layer/regions 30z are provided by ion implanting into bulk substrate 12. The left illustrated n-type electron collector layer implant 30z extends to second n-well 22 periphery 26 to be in electrical connection with second n-well 22, and is spaced, as shown, from first n-well 24 periphery 28 for preventing electrical connection therewith. An example and preferred n-type buried layer implant process is with phosphorus ion implanted at an energy of 2.0 to 3.0 MeV at a dose of $1\times10^{12}$–$5\times10^{13}$ atoms/cm$^2$ to provide a resultant peak concentration of layer/region 30z of $5\times10^{16}$–$1\times10^{18}$ ions/cm$^3$, to provide layer 30z in the illustrated final or resultant spatial relationship relative to the n-wells and p-wells.

Figure 3:
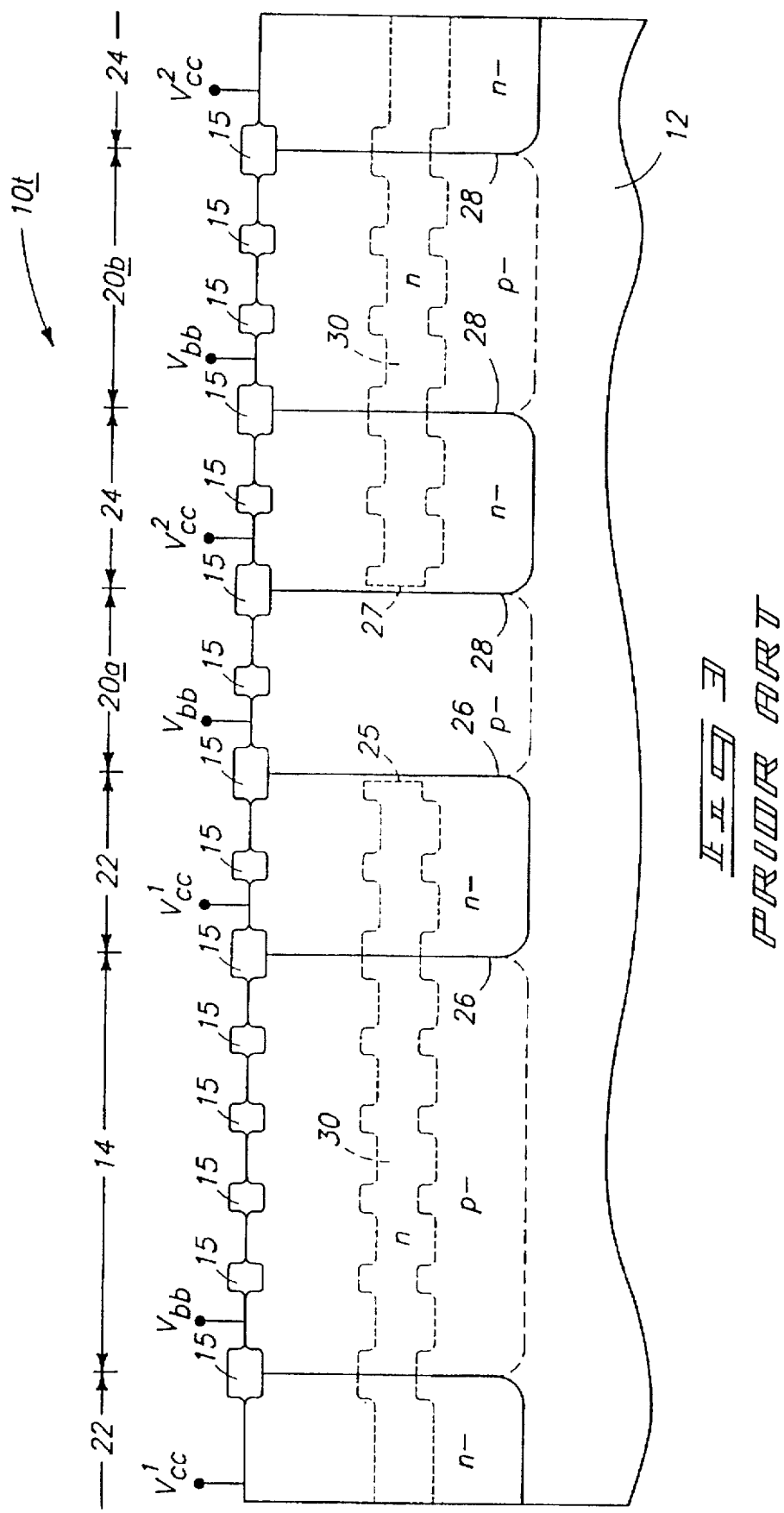
FIG. 3 is a diagrammatic sectional view of another alternate prior art semiconductor wafer fragment and is discussed in the "Background" section above.

Further and with first and second masking blocks 54 and 56 in place, a retrograde p-well layer 32z is provided by ion implanting into substrate 12 immediately above layer 30z. Such minimizes the depletion width of the p-n junction formed between the p-well and n-type buried layer 30z. Further, such restricts diffusion of n-type material from buried n-type electron collector layer 30z. Thus, an n-type electron collector layer implant and a p-type diffusion barrier layer implant thereto are provided into a semiconductor substrate in separate implanting steps using the same implant mask during the separate implantings. This is contrary and distinct from the prior art process depicted by FIG. 3. An example and preferred retrograde p-well implant process ion implants boron at an energy of 0.5 to 1.0 MeV at a dose of $1\times10^{12}$–$1\times10^{13}$ atoms/cm$^2$ to provide a resultant peak concentration of layer/region 32b of $1\times10^{16}$–$1$—$10^{17}$ atoms/cm$^3$.

Further and with first and second masking blocks 54 and 56 in place, a p-type NMOS channel stop layer 60 is provided by ion implantation. Layer 60 will have a slightly greater depth in areas of the substrate not covered by field oxide than in the areas directly beneath the field oxide. An example and preferred dopant ion for region 60 is boron. For example, where field oxide regions 15 are 4000 Angstroms thick, an example implant energy is at 80 KeV with an implant dose of $1\times10^{12}$–$8\times10^{12}$ ions/cm$^2$ to produce a resultant peak concentration of layer 60 of approximately $5\times10^{17}$ ions/cm$^3$. The goal or intent is to provide implant 60 just beneath the field oxide regions to enhance electrical isolation between adjacent active regions.

Further and with first and second masking blocks 54 and 56 in place, a p-type NMOS $V_T$ adjust ion implant 64 is provided into substrate 12. A preferred dopant material is boron. Example implant conditions include 30 KeV at a dose of $1\times10^{12}$–$5\times10^{12}$ ions/cm$^2$ to provide an example resultant peak concentration of $1\times10^{17}$ ions/cm$^3$.

Implants 64, 60 and 32z are all p-type implants which preferably comprise boron. The most preferred sequencing for the implants is to provide the implants in the order of 64, 60 and 32b, followed by the phosphorus n-type implanting of n-type electron collector layer 30z. Alternately, layer 30z could be implanted first, followed by implanting of layers 64, 60 and 32z in any order. Least preferred would be providing layer 30z intermediate of the provision of the common boron implantings of layers 64, 60 and 32z.

Although the above described process was described principally relative to fabrication of memory integrated circuitry, the artisan will appreciate aspects of the invention also being applicable to fabrication of other circuitry, with the invention only being limited by the accompanying claims appropriately interpreted in accordance with the doctrine of equivalents.

The above described process provides the advantage of provision of at least two of the above described implants utilizing a single mask.

Subsequent processing would strip photoresist masking blocks 54 and 56 from the wafer, followed by provision of diffusion regions, gate oxide layers and capacitor constructions and their associated circuitry. Electrical connections for providing voltage to the respective n-wells would most typically be provided by or through heavily n-doped regions at the outer surface of substrate 12.

The invention also comprises products produced by the above processes.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A semiconductor memory device having complementary metal oxide semiconductor circuitry comprising:
   a bulk semiconductor substrate having a memory array area and a peripheral area, the peripheral area including p-well area comprising NMOS peripheral circuitry, the peripheral area including a first n-well area and a second n-well area comprising respective PMOS peripheral circuitry, the first and second n-well areas being separate from one another and having respective peripheries;

a buried n-type electron collector layer implant within the bulk substrate, the n-type electron collector layer implant extending to the second n-well periphery to be in electrical connection therewith, the n-type electron collector layer implant being spaced from the first n-well periphery for preventing electrical connection therewith; and a retrograde p-well layer implant within the substrate substantially coincident in lateral size and position with, and elevationally above, the n-type electron collector layer implant.

2. A semiconductor memory device having complementary metal oxide semiconductor circuitry comprising:

a bulk semiconductor substrate having a memory array area and a peripheral area, the peripheral area including p-well area comprising NMOS peripheral circuitry, the peripheral area including a first n-well area and a second n-well area comprising respective PMOS peripheral circuitry, the first and second n-well areas being separate from one another and having respective peripheries;

a buried n-type electron collector layer implant within the bulk substrate, the n-type electron collector layer implant extending to the second n-well periphery to be in electrical connection therewith, the n-type electron collector layer implant being spaced from the first n-well periphery for preventing electrical connection therewith;

a retrograde p-well layer implant within the substrate substantially coincident in lateral size and position with, and elevationally above, the n-type electron collector layer implant; and a p-type channel stop implant within the substrate substantially coincident in lateral size and position with, and elevationally above, the retrograde p-well layer.

3. A semiconductor memory device having complementary metal oxide semiconductor circuitry comprising;

a bulk semiconductor substrate having a memory array area and a peripheral area, the peripheral area including p-well area comprising NMOS peripheral circuitry, the peripheral area including a first n-well area and a second n-well area comprising respective PMOS peripheral circuitry, the first and second n-well areas being separate from one another and having respective peripheries;

a buried n-type electron collector layer implant within the bulk substrate, the n-type electron collector layer implant extending to the second n-well periphery to be in electrical connection therewith, the n-type electron collector layer implant being spaced from the first n-well periphery for preventing electrical connection therewith;

a retrograde p-well layer implant within the substrate substantially coincident in lateral size and position with, and elevationally above, the n-type electron collector layer implant; and a p-type channel stop implant within the substrate substantially coincident in lateral size and position with, and elevationally above, the retrograde p-well layer implant.

4. A semiconductor memory device having complementary metal oxide semiconductor circuitry comprising;

a bulk semiconductor substrate having a memory array area and a peripheral area, the peripheral area including p-well area comprising NMOS peripheral circuitry, the peripheral area including a first n-well area and a second n-well area comprising respective PMOS peripheral circuitry, the first and second n-well areas being separate from one another and having respective peripheries;

a buried n-type electron collector layer implant within the bulk substrate, the n-type electron collector layer implant extending to the second n-well periphery to be in electrical connection therewith, the n-type electron collector layer implant being spaced from the first n-well periphery for preventing electrical connection therewith;

a retrograde p-well layer implant within the substrate substantially coincident in lateral size and position with, and elevationally above, the n-type electron collector layer implant;

a p-type channel stop implant within the substrate substantially coincident in lateral size and position with, and elevationally above, the retrograde p-well layer implant; and a p-type $V_T$ adjust implant within the substrate and elevationally above the p-type channel stop implant.

5. A semiconductor memory device having complementary metal oxide semiconductor circuitry comprising:

a bulk semiconductor substrate;

the substrate including p-well bulk substrate area comprising NMOS peripheral circuitry;

the substrate including a first n-well bulk substrate area and a second n-well bulk substrate area comprising respective PMOS peripheral circuitry, the first and second n-well areas being separate from one another and having respective peripheries; and a buried n-type electron collector layer implant within the bulk substrate, the n-type electron collector layer implant extending to the second n-well periphery to be in electrical connection therewith, the n-type electron collector layer implant being spaced from the first n-well periphery for preventing electrical connection therewith; and a retrograde p-well layer implant within the substrate substantially coincident in lateral size and position with, and elevationally above, the n-type electron collector layer implant.

6. A semiconductor memory device having complementary metal oxide semiconductor circuitry comprising:

a bulk semiconductor substrate;

the substrate including p-well bulk substrate area comprising NMOS peripheral circuitry;

the substrate including a first n-well bulk substrate area and a second n-well bulk substrate area comprising respective PMOS peripheral circuitry, the first and second n-well areas being separate from one another and having respective peripheries;

a buried n-type electron collector layer implant within the bulk substrate, the n-type electron collector layer implant extending to the second n-well periphery to be in electrical connection therewith, the n-type electron collector layer implant being spaced from the first n-well periphery for preventing electrical connection therewith;

a retrograde p-well layer implant within the substrate substantially coincident in lateral size and position with, and elevationally above, the n-type electron collector layer implant;

a p-type channel stop implant within the substrate substantially coincident in lateral size and position with, and elevationally above, the retrograde p-well layer implant; and a p-type $V_T$ adjust implant within the substrate and elevationally above the p-type channel stop implant.

* * * * *